(12) United States Patent
Kobayashi

(10) Patent No.: US 12,143,738 B2
(45) Date of Patent: Nov. 12, 2024

(54) PHOTOELECTRIC CONVERSION DEVICE AND ELECTRONIC DEVICE

(71) Applicant: CANON KABUSHIKI KAISHA, Tokyo (JP)

(72) Inventor: Hideo Kobayashi, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 96 days.

(21) Appl. No.: 17/690,229

(22) Filed: Mar. 9, 2022

(65) Prior Publication Data

US 2022/0303484 A1  Sep. 22, 2022

(30) Foreign Application Priority Data

Mar. 18, 2021  (JP) ................................ 2021-045159

(51) Int. Cl.
*H04N 25/75*  (2023.01)
*H01L 27/146*  (2006.01)

(52) U.S. Cl.
CPC ....... *H04N 25/75* (2023.01); *H01L 27/14603* (2013.01)

(58) Field of Classification Search
CPC .......................... H04N 25/75; H01L 27/14603
See application file for complete search history.

(56) References Cited

U.S. PATENT DOCUMENTS

| | | |
|---|---|---|
| 7,830,436 B2 | 11/2010 | Sumi et al. |
| 7,990,440 B2 | 8/2011 | Kobayashi et al. |
| 8,835,828 B2 | 9/2014 | Kobayashi |
| 9,264,634 B2 | 2/2016 | Oike et al. |
| 9,509,931 B2 | 11/2016 | Kobayashi et al. |
| 11,268,851 B2 | 3/2022 | Kobayashi et al. |
| 2010/0079611 A1* | 4/2010 | Suzuki .................. H04N 25/76 348/E5.022 |
| 2016/0227141 A1 | 8/2016 | Kobayashi et al. |
| 2019/0273883 A1* | 9/2019 | Sakakibara .......... H04N 25/533 |
| 2020/0260034 A1 | 8/2020 | Moue et al. |
| 2021/0021770 A1 | 1/2021 | Nakazawa et al. |

(Continued)

FOREIGN PATENT DOCUMENTS

| | | |
|---|---|---|
| JP | 2005-175517 A | 6/2005 |
| JP | 2013-251677 A | 12/2013 |

(Continued)

OTHER PUBLICATIONS

U.S. Appl. No. 17/588,484, filed Jan. 31, 2022 (First Named Inventor: Hideo Kobayashi).

(Continued)

*Primary Examiner* — Twyler L Haskins
*Assistant Examiner* — Fayez A Bhuiyan
(74) *Attorney, Agent, or Firm* — Venable LLP

(57) ABSTRACT

A photoelectric conversion device capable of operations corresponding to the amplitude of a signal read out to a vertical signal line is disclosed. The device comprises a pixel that generates a signal via photoelectric conversion and a determination circuit that determines an amplitude of a signal read out from the pixel to a vertical signal line. A reset signal and a data signal are read out from the pixel. The determination circuit performs a first determination on the data signal while the pixel is being selected for reading out a signal and performs a second determination on the reset signal.

13 Claims, 10 Drawing Sheets

(56) References Cited

U.S. PATENT DOCUMENTS

2021/0021777 A1  1/2021  Kobayashi et al.
2021/0021782 A1  1/2021  Sato et al.
2021/0391365 A1  12/2021 Kobayashi et al.

FOREIGN PATENT DOCUMENTS

JP  2019-057873 A   4/2019
WO  2019/069614 A1  4/2019

OTHER PUBLICATIONS

U.S. Appl. No. 17/693,521, filed Mar. 14, 2022 (First Named Inventor: Hideo Kobayashi).
U.S. Appl. No. 17/690,236, filed Mar. 9, 2022 (First Named Inventor: Hideo Kobayashi).
U.S. Appl. No. 17/690,255, filed Mar. 9, 2022 (First Named Inventor: Hideo Kobayashi).

* cited by examiner

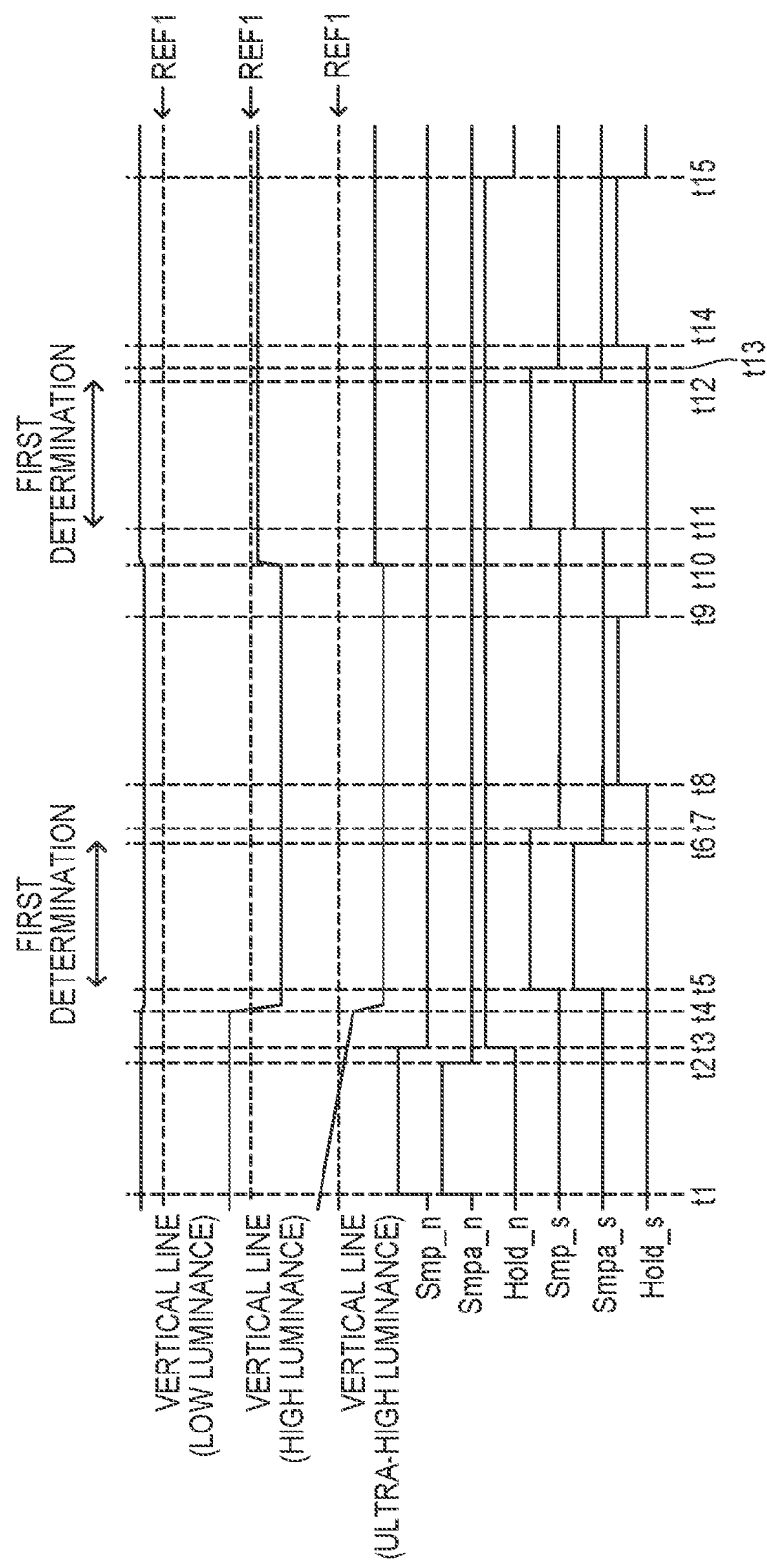

PHOTOELECTRIC CONVERSION DEVICE AND ELECTRONIC DEVICE

BACKGROUND OF THE INVENTION

Field of the Invention

The present invention relates to a photoelectric conversion device and an electronic device.

Description of the Related Art

In International Publication WO2019/069614A1, a solid-state image capture apparatus is described which includes a sample and hold unit with two sample and hold circuits in parallel for one vertical signal line and an analog-to-digital unit and an analog-to-digital unit configured to convert a pixel signal output from the sample and hold unit into a digital signal.

The configuration described in WO2019/069614A1 does not take into account operations corresponding to the amplitude of a signal read out to the vertical signal line.

SUMMARY OF THE INVENTION

The present invention, in one aspect, provides a photoelectric conversion device and an electronic device capable of operations corresponding to the amplitude of a signal read out to a vertical signal line.

According to an aspect of the present invention, there is provided a photoelectric conversion device, comprising: a pixel that generates a signal via photoelectric conversion; and a determination circuit that determines an amplitude of a signal read out from the pixel to a vertical signal line, wherein from the pixel, a reset signal and a data signal are read out; and the determination circuit performs a first determination on the data signal while the pixel is being selected for reading out a signal and performs a second determination on the reset signal.

According to another aspect of the present invention, there is provided a photoelectric conversion device, comprising: a pixel that generates a signal via photoelectric conversion; and a determination circuit that performs a determination of an amplitude of a signal read out from the pixel to a vertical signal line, wherein the determination circuit performs a plurality of types of the determination or performs the determination at number of times while the pixel is being selected for a signal to be read out; the pixel is capable of switching a capacity of a floating diffusion; and the determination circuit uses, for performing the determination, an identical reference value for a signal read out from the pixel with the capacity in a first capacity state and a signal read out from the pixel with the capacity in a second capacity state.

According to a further aspect of the present invention, there is provided a photoelectric conversion device, comprising: a pixel that generates a signal via photoelectric conversion; a current source that supplies a current to the pixel; and a determination circuit that performs a determination of an amplitude of a signal read out from the pixel to a vertical signal line, wherein a current is supplied from the current source to the determination circuit.

According to another aspect of the present invention, there is provided an electronic device, comprising: a photoelectric conversion device; and a control apparatus that controls operations of the photoelectric conversion device, wherein the photoelectric conversion device comprises: a pixel that generates a signal via photoelectric conversion; and a determination circuit that determines an amplitude of a signal read out from the pixel to a vertical signal line, wherein from the pixel, a reset signal and a data signal are read out; and the determination circuit performs a first determination on the data signal while the pixel is being selected for reading out a signal and performs a second determination on the reset signal.

According to a further aspect of the present invention, there is provided an electronic device, comprising: a photoelectric conversion device; and a control apparatus that controls operations of the photoelectric conversion device, wherein the photoelectric conversion device comprises: a pixel that generates a signal via photoelectric conversion; and a determination circuit that performs a determination of an amplitude of a signal read out from the pixel to a vertical signal line, wherein the determination circuit performs a plurality of types of the determination or performs the determination at number of times while the pixel is being selected for a signal to be read out; the pixel is capable of switching a capacity of a floating diffusion; and the determination circuit uses, for performing the determination, an identical reference value for a signal read out from the pixel with the capacity in a first capacity state and a signal read out from the pixel with the capacity in a second capacity state.

According to another aspect of the present invention, there is provided a substrate stacked on a substrate provided with a pixel that generates a signal via photoelectric conversion, comprising: a determination circuit that determines an amplitude of a signal read out from the pixel to a vertical signal line, wherein from the pixel, a reset signal and a data signal are read out; and the determination circuit performs a first determination on the data signal while the pixel is being selected for reading out a signal and performs a second determination on the reset signal.

According to a further aspect of the present invention, there is provided a substrate stacked on a substrate provided with a pixel that generates a signal via photoelectric conversion, comprising: a determination circuit that performs a determination of an amplitude of a signal read out from the pixel to a vertical signal line, wherein the determination circuit performs a plurality of types of the determination or performs the determination at number of times while the pixel is being selected for a signal to be read out; the pixel is capable of switching a capacity of a floating diffusion; and the determination circuit uses, for performing the determination, an identical reference value for a signal read out from the pixel with the capacity in a first capacity state and a signal read out from the pixel with the capacity in a second capacity state.

According to another aspect of the present invention, there is provided a substrate stacked on a substrate provided with a pixel that generates a signal via photoelectric conversion, comprising: a current source configured to supply a current to the pixel; and a determination circuit for performing a determination of an amplitude of a signal read out from the pixel to a vertical signal line, wherein a current is supplied from the current source to the determination circuit.

Further features of the present invention will become apparent from the following description of exemplary embodiments (with reference to the attached drawings).

BRIEF DESCRIPTION OF THE DRAWINGS

FIG. 10 is a timing diagram relating to an example operation of the photoelectric conversion device of FIG. 1 according to a fifth modified example.

DESCRIPTION OF THE EMBODIMENTS

Figure 1:
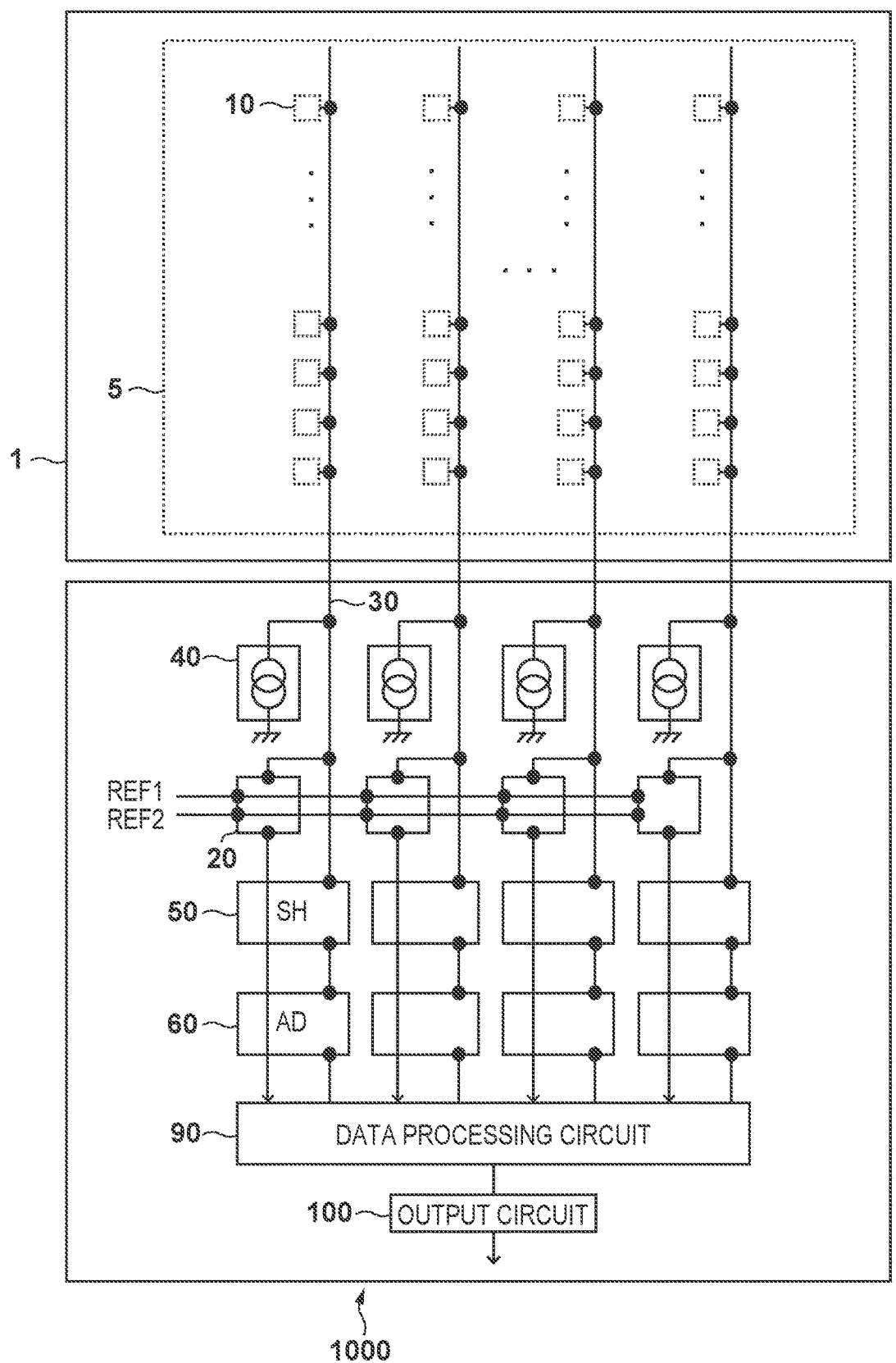
FIG. 1 is a block diagram illustrating an example configuration of a photoelectric conversion device according to an embodiment.

Hereinafter, embodiments will be described in detail with reference to the attached drawings. Note, the following embodiments are not intended to limit the scope of the claimed invention. Multiple features are described in the embodiments, but limitation is not made to an invention that requires all such features, and multiple such features may be combined as appropriate. Furthermore, in the attached drawings, the same reference numerals are given to the same or similar configurations, and redundant description thereof is omitted.

FIG. 1 is a block diagram illustrating an example configuration of a photoelectric conversion device 1000 according to an embodiment of the present invention. The photoelectric conversion device 1000 has a structure in which a first substrate 1 and a second substrate 2 are electrically connected. The first substrate 1 includes a pixel array 5. Also, the second substrate 2 includes a current source 40, a determination circuit 20, a sample and hold unit (SH) 50, a conversion unit (AD) 60, a data processing circuit 90, and an output circuit 100. The photoelectric conversion device 1000 may be a CMOS image sensor, for example.

In the pixel array 5, pixels 10 including a photoelectric conversion device such as a photodiode are arranged in rows and columns. Hereinafter, the left-and-right direction in FIG. 1 refers to the row direction or horizontal direction, and the up-and-down direction in FIG. 1 refers to the column direction or the vertical direction. Also, the groups of pixels arranged in the row direction in the pixel array 5 are referred to as pixel rows, and the groups of pixels arranged in the column direction are referred to as pixel columns. Furthermore, regarding the transfer direction of signals, the direction toward the pixels 10 is referred to as upstream or early stage, and the direction toward the output circuit 100 is referred to as downstream or later stage.

Each one of the pixels 10 generates a signal including a voltage value corresponding to the amount of incident light during exposure. Vertical signal lines 30 corresponding to pixel columns are provided in the pixel array 5. In FIG. 1, an example is illustrated in which one vertical signal line 30 is provided for each pixel column. However, a plurality of vertical signal lines 30 may be provided for each pixel column. The vertical signal line 30 transfers a signal from, from among the connected pixels 10, the pixel 10 belonging to the pixel row selected by an external vertical scanning circuit to the determination circuit 20 and the sample and hold unit 50.

One current source 40 is provided for each vertical signal line 30. The current source 40 supplies a bias current via the vertical signal line 30 to the pixel 10 selected for reading out of a signal.

The determination circuit 20 determines the amplitude of the signal supplied via the vertical signal line 30 and outputs a determination result. Amplitude represents the amount of change from a reference potential. The amplitude may be determined by determining the magnitude relationship with a reference value, for example. In FIG. 1, an example is illustrated in which two types of reference values are used in determining the amplitude, a first reference value REF1 and a second reference value REF2. Accordingly, the determination circuit 20 is capable of performing a first determination using the first reference value REF1 and a second determination using the second reference value REF2. The determination result may be used in the later stage processing by the photoelectric conversion device 1000 and the processing at an external circuit of the photoelectric conversion device 1000. The determination result may be used in accordance with the circuit that uses the determination result or the purpose, and how the determination result is used is not limited.

The sample and hold unit 50 samples and holds signals generated by the photoelectric conversion devices of the pixels 10 from the pixel array 5 and via the vertical signal lines 30. The sample and hold unit 50 includes a sample and hold circuit that samples and holds a reset signal and a sample and hold circuit that samples and holds a data signal, both being connected to the vertical signal line 30. The reset signal is a signal generated when the charge stored by the pixel is reset. Also, the data signal is a signal based on the charge generated in the exposure period by the photoelectric conversion device.

One conversion unit 60 is provided for each sample and hold unit 50. The conversion unit 60 is an A/D converter circuit that analog-to-digital converts a signal output from the corresponding sample and hold unit 50 and outputs a digital signal. Specific examples of an A/D converter circuit include a slope analog-to-digital conversion circuit, a successive-approximation analog-to-digital conversion circuit, a delta-sigma ($\Delta\Sigma$) analog-to-digital conversion circuit, and the like. However, the A/D converter circuit is not limited thereto.

The data processing circuit 90 applies a predetermined process to the digital signal output from the conversion unit 60 and performs an output. The data processing circuit 90 may apply digital gain to the digital signal, apply correction processing, apply complementation processing, and the like, for example.

The output circuit 100 outputs a digital signal processed at the data processing circuit 90 to outside of the photoelectric conversion device 1000.

Figure 2:
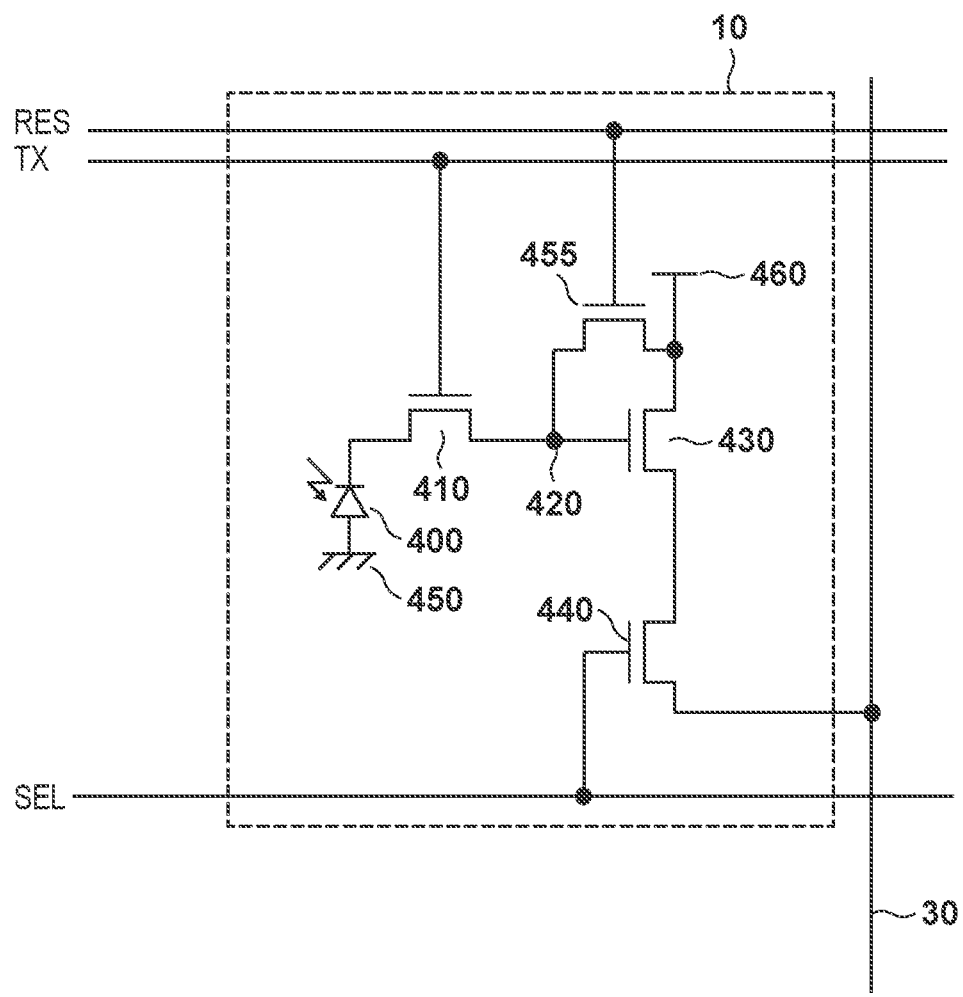
FIG. 2 is a circuit diagram illustrating an example configuration of a pixel of the photoelectric conversion device of FIG. 1.

FIG. 2 is a circuit diagram illustrating an example configuration of the pixel 10. The pixel 10 includes a photoelectric conversion device 400 such as a photodiode, a transfer transistor 410, a reset transistor 455, an amplification transistor 430, and a selection transistor 440. The photoelectric conversion device 400 is connected to a ground potential 450 at one of the main electrodes and generates a signal charge (for example, a photoelectron) of an amount corresponding to the amount of received light. The other main electrode of the photoelectric conversion device 400 is electrically connected to a gate electrode of the amplification transistor 430 via the transfer transistor 410. A node 420 electrically connected to a gate electrode of the amplification transistor 430 functions as the floating diffusion (FD). The floating diffusion converts the charge generated at the photoelectric conversion device 400 to voltage.

The gate electrode of the transfer transistor 410 is supplied with a transfer signal TX. By the transfer transistor 410 being set to a conductive state in response to the transfer signal TX, a charge generated at the photoelectric conversion device 400 and stored by the photoelectric conversion device 400 is transferred to the node 420, i.e., the floating diffusion. The electric potential of the node 420 in a charge transferred state corresponds to the data signal described above.

The reset transistor 455 is connected between a power supply electric potential 460 and the node 420. In the present specification, a transistor being connected between A and B means that one of the main electrodes of the transistor is connected to A and the other is connected to B and that the gate electrode of the transistor is not connected to A or B.

A reset signal RES is supplied to the gate electrode of the reset transistor 455. By the reset transistor 455 being set to a conductive state in response to the reset signal RES, the electric potential of the node 420 (floating diffusion) is reset to the power supply electric potential 460. The electric potential of the node 420 with the reset transistor 455 in a conductive state corresponds to the reset signal described above.

Regarding the amplification transistor 430, the gate electrode is connected to the node 420, one of the main electrodes is connected to the power supply electric potential 460, and the other main electrode is connected to the selection transistor 440. The amplification transistor 430 is a source follower input circuit that outputs a signal generated via photoelectric conversion of the pixel 10 by the photoelectric conversion device 400 to the vertical signal line 30. Thus, the other one of the main electrodes of the amplification transistor 430 is electrically connected to the vertical signal line 30 via the selection transistor 440. The amplification transistor 430 and the current source 40 connected to the vertical signal line 30 form a source follower that converts a voltage of the node 420 to an electric potential of the vertical signal line 30.

The selection transistor 440 is connected between the amplification transistor 430 and the vertical signal line 30. The gate electrode of the selection transistor 440 is supplied with a selection signal SEL. By the selection transistor 440 being set in a conductive state in response to the selection signal SEL, the pixel 10 is set to a selected state. Thus, a signal is read out from the pixel 10 in a selected state to the vertical signal line 30.

The circuit configuration of the pixel 10 is not limited to the configuration illustrated in FIG. 2. For example, the selection transistor 440 may be connected between the power supply electric potential 460 and the amplification transistor 430. Also, in the configuration illustrated in FIG. 2, the pixel 10 has a four transistor (4Tr) structure including the transfer transistor 410, the reset transistor 455, the amplification transistor 430, and the selection transistor 440, but the structure is not limited thereto. For example, a 3Tr structure may be used in which the selection transistor 440 is omitted and the amplification transistor 430 functions as a selection transistor. Also, depending on the specifications required for the photoelectric conversion device 1000, a 5Tr or higher structure with a higher number of transistors may be used. From the pixel 10, the electric potential of the node 420 may be reset by the reset transistor 455, and a reset signal generated by the photoelectric conversion device 400 is reset and a data signal of a signal level of when the photoelectric conversion device 400 performed photoelectric conversion may be output in this order.

Figure 3:
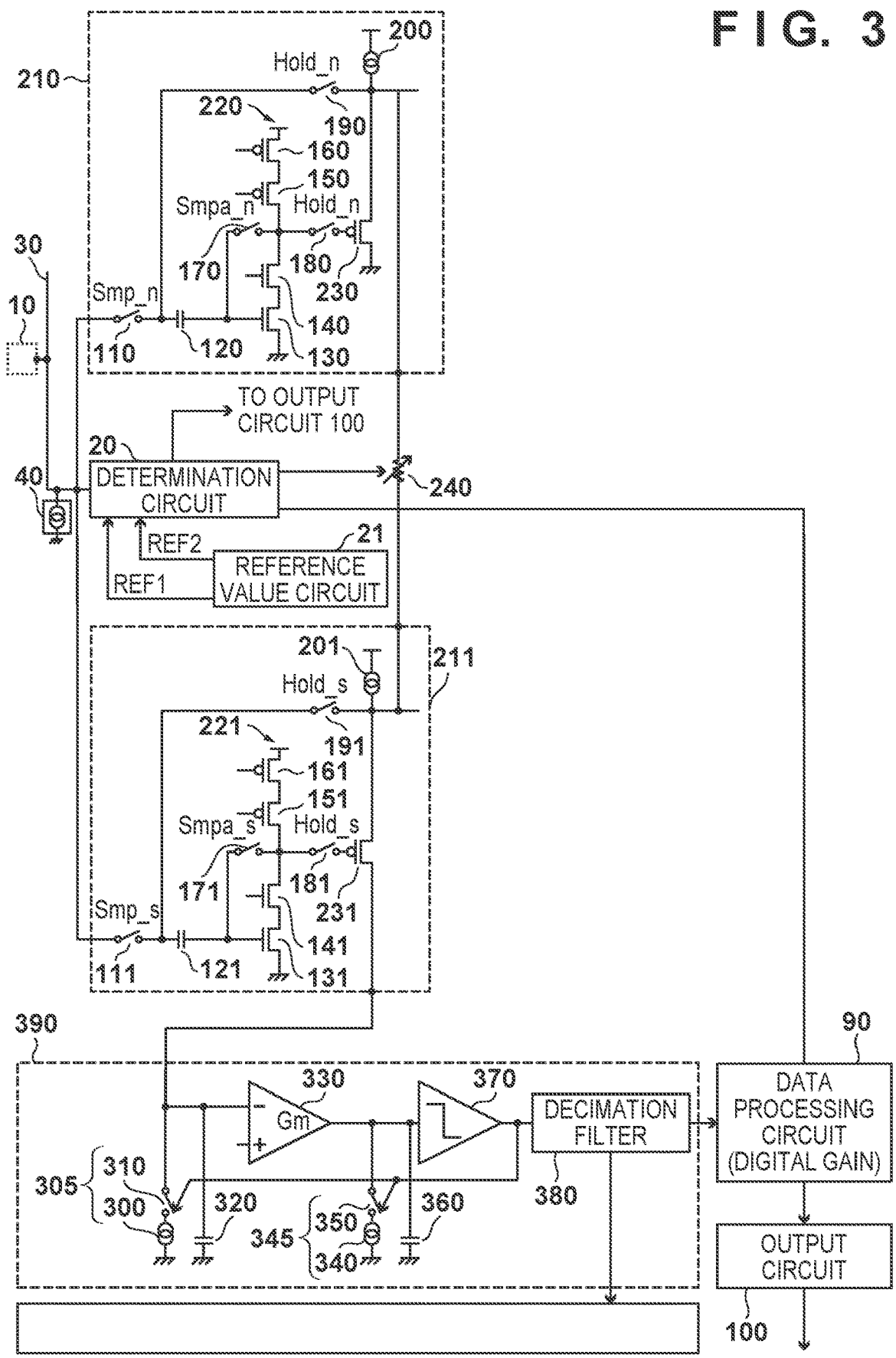
FIG. 3 is a circuit diagram illustrating an example configuration of a sample and hold unit and a conversion unit of the photoelectric conversion device of FIG. 1.

FIG. 3 is a diagram illustrating an example configuration of the photoelectric conversion device 1000 focusing on the circuit provided with the second substrate 2. A sample and hold circuit 210 that samples and hold a reset signal and a sample and hold circuit 211 that samples and holds a data signal are connected to a single vertical signal line 30. The sample and hold circuits 210 and 211 form the sample and hold unit 50. The output of the sample and hold unit 50 is supplied, from the sample and hold circuit 211, to an analog-to-digital conversion circuit 390 forming the conversion unit 60.

The determination circuit 20, the sample and hold circuits 210, 211, and the analog-to-digital conversion circuit 390 are provided on each vertical signal line 30. Thus, in a case where the number of vertical signal lines 30 is increased due to an increase in pixels, the space in which these circuits are disposed also increases. In the present embodiment, these circuits are disposed on the second substrate 2, which is different to the first substrate 1 with the pixel array 5 is provided, and the first substrate 1 and the second substrate 2 are stacked on one another. This helps reduce restrictions on circuit arrangement and allows the chip area to be made smaller.

The determination circuit 20 determines the amplitude of the signal read out from the pixel 10 to the vertical signal line 30 using the reference value. The reference value, for example, is supplied to the determination circuit 20 from a reference value circuit provided in the photoelectric conversion device 1000 or an external circuit. Here, the first reference value REF1 and the second reference value REF2 are supplied to the determination circuit 20. Accordingly, the determination circuit 20 is capable of performing the first determination using the first reference value REF1 and the second determination using the second reference value REF2.

Here, for example, the result of the first determination is used in the automatic gain control (AGC) of the signal, and the result of the second determination is used in the blackened pixel detection (blackened high-luminance pixels). Thus, the result of the first determination is used, by the photoelectric conversion device 1000, in the control of analog gain (resistance value of a variable resistor 240) and the control of digital gain (multiplying factor or coefficient used at the data processing circuit 90). Also, the result of the first determination is used for substituting the signal of a blackened pixel for the signal of a saturation level. This correction may be performed at an internal of the photoelectric conversion device 1000 (for example, by the data processing circuit 90) or at an external of the photoelectric conversion device 1000. In a case where this correction is performed at an external, the result of the second determination can be output to the external of the photoelectric conversion device 1000 via the output circuit 100. However, the use of the amplitude determination result is not limited to that described above, and output destination of the amplitude determination result may also be changed depending on the use.

The circuit configuration of the sample and hold unit 50 and the conversion unit 60 will now be described. The sample and hold circuit 210 for the reset signal includes a capacitive device 120 and an inverting amplifier 220. A switch 110 switches the connection state of the vertical signal line 30 and the capacitive device 120 between a connected state and a disconnected state in accordance with a control signal Smp_n. The inverting amplifier 220 may be constituted by a combination of a source ground circuit and a source follower circuit. The inverting amplifier 220 includes transistors 130, 140, 150, 160, switches 170, 180, 190, and a current source 200. The switch 170 is connected between the inverting input end and an output end of the inverting amplifier 220 and is controlled by a control signal Smpa_n. The reset signal is output from the inverting amplifier 220 in accordance with a control signal Hold_n.

The sample and hold circuit 211 for the data signal has a similar configuration to the sample and hold circuit 210 for the reset signal. Specifically, the sample and hold circuit 211 includes a capacitive device 121 and an inverting amplifier 221. A switch 111 switches the connection state of the vertical signal line 30 and the capacitive device 121 between a connected state and a disconnected state in accordance with a control signal Smp_s. The inverting amplifier 221 may be constituted by a combination of a source ground circuit and a source follower circuit. The inverting amplifier 221 includes transistors 131, 141, 151, 161, switches 171, 181, 191, and a current source 201. The switch 171 is connected between the inverting input end and an output end of the inverting amplifier 221 and is controlled by the control signal Smpa_s. The data signal is output from the inverting amplifier 221 in accordance with a control signal Hold_s.

A variable resistance device 240 is provided between the output end of the sample and hold circuit 210 for the reset signal and the output end of the sample and hold circuit 211 for the data signal. The resistance value of the variable resistance device 240 is controlled in accordance with the result of the first determination by the determination circuit 20. In a case where the amplitude of the signal is low (lower than the first reference value REF1), for example, the determination circuit 20 lowers the resistance value of the variable resistance device 240 more so than in a case where this is not the case. Accordingly, the gain is increased for the signal with a low amplitude, and dark noise in a captured image can be reduced.

The resistance value of the variable resistance device 240 is referred to as analog gain as it is the gain used for the analog signal. In a case where analog gain is changed, gain is applied at the data processing circuit 90 to offset this change. The gain applied by the data processing circuit 90 is referred to as digital gain as its target is the digital signal after A/D conversion. The value of the analog gain and the digital gain is set so that the product is one. Thus, in a case where the analog gain is made greater than 1, the digital gain is made less than 1.

A current I running in the variable resistance device 240 is:

$$I=(Vn-Vs)/R$$

wherein, Vn is the electric potential of the output end of the sample and hold circuit 210, i.e., the electric potential of the reset signal, Vs is the electric potential of the output end of the sample and hold circuit 211, i.e., the electric potential of the data signal, and R is the resistance value of the variable resistance device 240.

The current I is input to the analog-to-digital conversion circuit 390. The current I running in the variable resistance device 240 is proportional to the difference between the electric potential Vn of the reset signal of the pixel and the electric potential Vs of the data signal. Thus, the current I after correlated double sampling (CDS) is input to the analog-to-digital conversion circuit 390 of the conversion unit 60. Also, by decreasing the resistance value R of the variable resistance device 240 below the reference value, a plus gain can be applied to the post-CDS data signal (Vn−Vs).

Note that a configuration other than the circuit configuration described here may be used. For example, a configuration that takes the output of the sample and hold circuits 210 and 211 as an input and uses a CDS circuit that obtains the difference between the data signal and the reset signal to obtain a post-CDS data signal may be used.

In FIG. 3, as an example of the analog-to-digital conversion circuit 390 provided in the conversion unit 60, the analog-to-digital conversion circuit 390 is illustrated as a delta-sigma (ΔΣ) analog-to-digital conversion circuit. The ΔΣ analog-to-digital conversion circuit 390 includes a first integrator, a second integrator, a quantizer 370, and a decimation filter 380. In the analog-to-digital conversion circuit 390, the first integrator is constituted by an integration capacitor 320. The second integrator is constituted by a Gm-cell 330 that converts voltage to current and an integration capacitor 360.

A digital-to-analog converter 305 including a current source 300 and a switch 310 is connected to the input node of the first integrator. The digital-to-analog converter 305 controls the current to the first integrator in accordance with a digital signal via the second integrator and the quantizer 370. A digital-to-analog converter 345 including a current source 340 and a switch 350 is connected to the input node of the second integrator. The digital-to-analog converter 345 controls the current to the second integrator in accordance with the result of quantization of the output of the second integrator by the quantizer 370.

In the ΔΣ analog-to-digital conversion circuit 390, the previous quantized value in the quantizer 370 is fed back to the second integrator and the first integrator via the digital-to-analog converters 305 and 345. In this manner, by feeding back the previous quantized value to the digital-to-analog converters 304 and 345 and passing it twice through the integrators, a second-order noise shaping characteristic can be obtained. Furthermore, by removing high-frequency noise via the decimation filter 380 disposed at a later stage than the quantizer 370, an analog-to-digital conversion output with high accuracy can be obtained.

The digital signal output from the decimation filter 380 is input to the data processing circuit 90. The data processing circuit 90 applies a predetermined process, which includes applying digital gain, to the digital signal and outputs the result to the output circuit 100. The data processing circuit 90 controls the magnitude of the digital gain applied to the digital signal on the basis of the result of the first determination received from the determination circuit 20. The digital gain may be applied via multiplication of the value of the digital signal by the gain coefficient.

Figure 4:
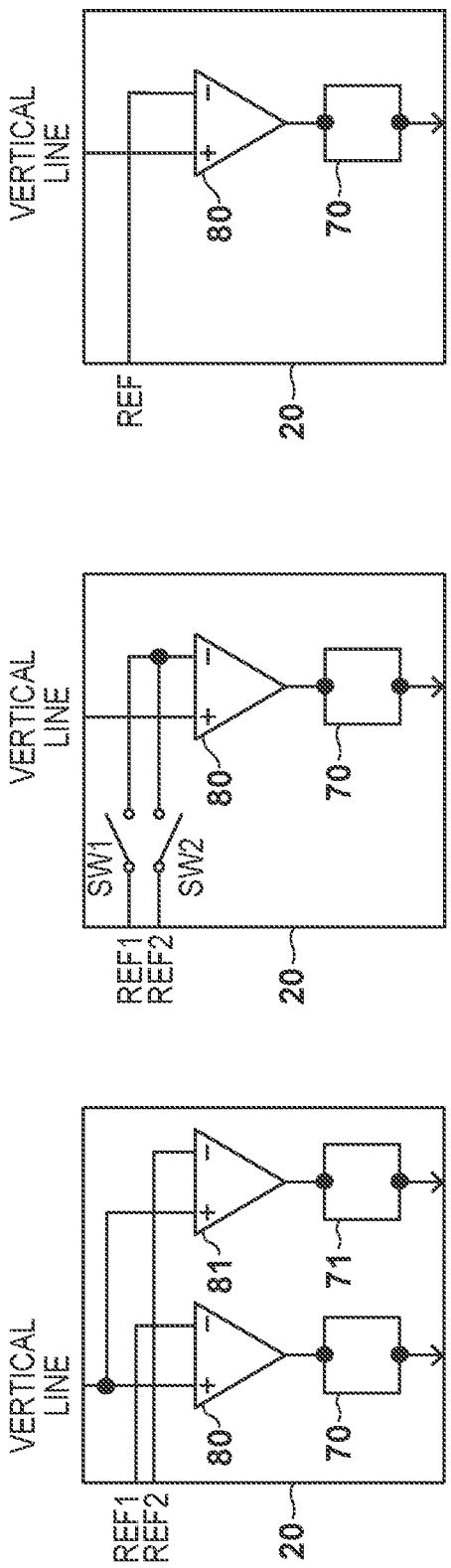
FIGS. 4A to 4C are circuit diagrams illustrating example configurations of a determination circuit of the photoelectric conversion device of FIG. 1.

FIGS. 4A to 4C are circuit diagrams illustrating example configurations of the determination circuit 20. The determination circuits 20 illustrated in FIGS. 4A to 4C all have a configuration able to accommodate a plurality of types of reference values. The determination circuit 20 illustrated in FIG. 4A includes the same number of determinators and latches as the number of types of reference values used in the determination. In this example, a configuration in which two types of reference values are used is illustrated, and a comparator 80 functioning as a first determinator that performs the first determination using the first reference value REF1 and a comparator 81 functioning as a second determinator that performs the second determination using the second reference value REF2 are provided. The result of the first determination is stored in a latch 70, and the result of the second determination is stored in a latch 71. The comparators 80 and 81 output a high level or a low level depending on the magnitude relationship between the electric potential of the vertical signal line 30 and the reference value.

In the configuration of FIG. 4B, the reference value is selectively input to the comparator, allowing for the number of comparators to be less than the number in the configuration of FIG. 4A. The determination circuit 20 includes one comparator 80 and one latch 70. Also, the determination circuit 20 includes switches SW1 and SW2 for selectively inputting the first reference value REF1 and the second reference value REF2 to the single comparator 80. The control signal of the switches SW1 and SW2 is supplied as a single control signal for controlling the read out operation of the signal from the pixel, for example.

In the configuration of FIG. 4C, there is one reference value input line, allowing the number of switches to be reduced from the two switches SW1 and SW2 in the configuration of FIG. 4B. In a case where the determination circuit 20 of the configuration of FIG. 4C is used, the value of the reference value REF input into the comparator 80 is variable. Specifically, the first reference value REF1 is input into the comparator 80 in the period in which the first determination is performed, and the second reference value REF2 is input into the comparator 80 in the period in which the second determination is performed.

The reference value used by the determination circuit 20 can be supplied from a reference value circuit 21 provided inside the photoelectric conversion device 1000 or from an external of the photoelectric conversion device 1000.

Figure 5:
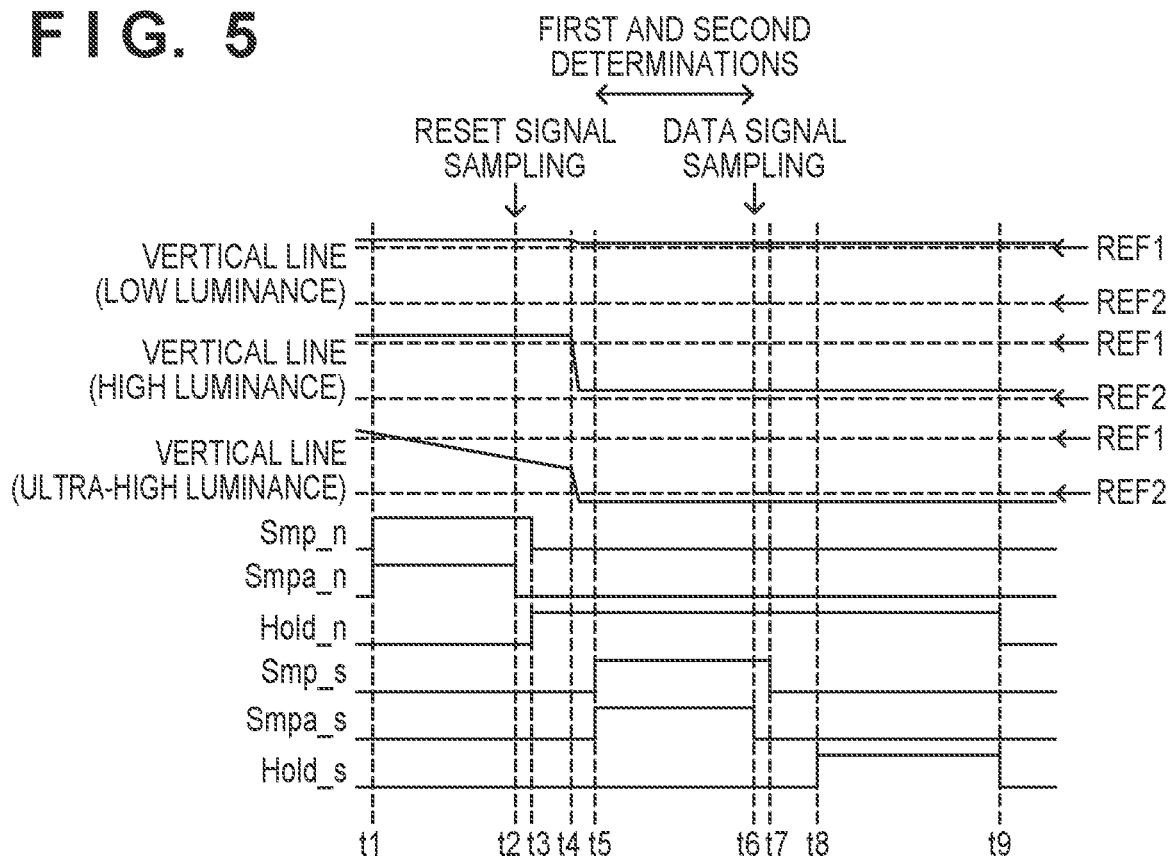
FIG. 5 is a timing diagram relating to an example operation of the photoelectric conversion device of FIG. 1.

FIG. 5 is a diagram illustrating an example of a change in the electric potential of the vertical signal line 30 in accordance with the magnitude of the amount of incident light of the selected pixel and the operation timing of the switches of the sample and hold circuits 210 and 211. The first reference value REF1 and the second reference value REF2 used at the determination circuit 20 are also illustrated. Note that the determination circuit 20 here has the configuration illustrated in FIG. 4A.

Here, three examples of the change in electric potential of the vertical signal line 30 are illustrated, namely an example in which the amount of incident light of the pixel 10 is small (low luminance), an example in which the amount is large (high luminance), and an example in which the amount is very large (ultra-high luminance). Note that ultra-high luminance corresponds to a state in which a phenomenon (called blooming) where the charge generated at the photoelectric conversion device of the pixel overflows into the floating diffusion occurs. Low luminance and high luminance are typical examples with a small amount of incident light and a large amount of incident light, respectively, within a range in which blooming does not occur. In the present embodiment, the pixel 10 stores electrons via photoelectric conversion. Thus, the electric potential of the vertical signal line 30 decreases further from the reference potential the larger the amount of incident light of the pixel 10.

Control signals Smp_n, Smpa_n, Hold_n, smp_s, smpa_s, Hold_s in FIG. 5 are control signals of the switches in FIG. 3 with the same name. Here, while the control signal is a high level, the corresponding switch is set to an on state (conductive state), and while the control signal is a low level, the corresponding switch is set to an off state (non-conductive state).

First, at time t1, the control signals Smp_n and Smpa_n are set to a high level, and, at the sample and hold circuit 210 for the reset signal, the switches 110 and 170 are set to an on state. Next, at time t2 when the control signal Smpa_n transitions from high level to low level, the electric potential Vn of the reset signal is sampled and stored in the capacitive device 120.

Next, at time t3, the control signal Smp_n transitions from high level to low level. Also, by the control signal Hold_n being high level and the switches 180 and 190 being set to an on state, at the sample and hold circuit 210, the capacitive device 120 holds the electric potential Vn of the reset signal. The charge sampled and held by the capacitive device 120 is output from the sample and hold circuit 210 for the reset signal.

At time t4, the signal generated at the photoelectric conversion device 400 is output from the pixel 10 to the vertical signal line 30. Next, at time t5, the control signals Smp_s and Smpa_s are set to a high level, and, at the sample and hold circuit 211 for the data signal, the switches 111 and 171 are set to an on state. Next, at time t6 when the control signal Smpa_s transitions from high level to low level, the electric potential Vs of the data signal is sampled and stored in the capacitive device 121. The determination circuit 20 determines the amplitude in the period from time t5 to t6.

Next, at time t7, the control signal Smpa_s transitions from high level to low level. Also, at time t8, by the control signal Hold_s being high level and the switches 181 and 191 being set to an on state, at the sample and hold circuit 211, the capacitive device 121 holds the electric potential Vs of the data signal. The charge sampled and held by the capacitive device 121 is output from the sample and hold circuit 211 for the data signal.

As described above, a current corresponding to the difference between the electric potential Vn of the reset signal at the output end of the sample and hold circuit 210 and the electric potential Vs of the data signal at the output end of the sample and hold circuit 211 is input into the analog-to-digital conversion circuit 390. Then, at time t9, the control signals Hold_n and Hold_s are low level, and sampling of the reset signal and the data signal of the next pixel 10 is started.

Next, the relationship between the magnitude of the amount of incident light of the pixel and the amplitude determination result at the determination circuit 20 will be described. Here, the first reference value REF1 purposed for AGC control and the second reference value REF2 purposed for blackened pixel detection are supplied. Thus, the first reference value REF1 includes a predetermined value for detecting the signal of a luminance level included in a range in which the analog gain is increased. Also, the second reference value REF2 includes a value for detecting the electric potential of the vertical signal line 30 exceeding the saturation level.

In a case where the amount of incident light of the pixel is small and a signal corresponding to low luminance is output, the decrease in the electric potential of the vertical signal line 30 at time t4 is small, and the electric potential does not decrease below the first reference value REF1. As a result, the comparator 80 of the determination circuit 20 outputs a high level as the result of the first determination. This means that the read out data signal is a signal in the luminance range in which the analog gain is increased. Also, because the electric potential of the vertical signal line 30 does not decrease below the second reference value REF2, the comparator 81 and the determination circuit 20 outputs a high level as the result of the second determination. This means that blackened has not occurred in the data signal.

In a case where the amount of incident light is such that charge does not overflow from the pixel and a signal corresponding to high luminance is output, the decrease in the electric potential of the vertical signal line 30 at time t4 is large, and the electric potential decreases below the first reference value REF1. As a result, the comparator 80 of the determination circuit 20 outputs a low level as the result of the first determination. This means that the read out data signal is not a signal in the luminance range in which the analog gain is increased. Also, because the electric potential of the vertical signal line 30 does not decrease below the second reference value REF2, the comparator 81 and the determination circuit 20 outputs a high level as the result of the second determination. This means that blackened has not occurred in the data signal.

In the case of ultra-high luminance causing blooming, the photoelectric conversion device is saturated. Thus, in the data signal sampling period from time t5 to t6, the electric potential of the vertical signal line 30 detected by the determination circuit 20 decreases below the first reference value REF1. As a result, the comparator 80 of the determination circuit 20 outputs a low level as the result of the first determination.

Also, due to charge overflowing from the photoelectric conversion device, at time t4 when the data signal is output to the vertical signal line 30, the electric potential of the floating diffusion is less than normal. Because, from this state, charge of a saturation level is also transferred to the floating diffusion, the electric potential of the vertical signal line 30 detected by the determination circuit 20 in the period from time t5 to t6 reaches a supersaturation level and decreases below the second reference value REF2. As a result, the comparator 81 of the determination circuit 20 outputs a low level as the result of the second determination. This means that blackened has occurred in the data signal.

While the pixel 10 is being selected for the signal to be read out, the determination circuit 20 performs the first determination using the first reference value REF1 and the second determination using the second reference value REF2. Also, the determination result is held in both the latches 70 and 71 and can be used in the later stage processing in the photoelectric conversion device 1000 and/or the processing outside of the photoelectric conversion device 1000.

Here, the result of the first determination is used, in the photoelectric conversion device 1000, in the adjustment of the resistance value (analog gain) of the variable resistance device 240 by the determination circuit 20 and in the adjustment of the digital gain applied at the data processing circuit 90. Also, the result of the second determination can be used for correcting the blackened data signal, for example. This correction may be performed at an internal of the photoelectric conversion device 1000 (for example, by the data processing circuit 90) or at an external of the photoelectric conversion device 1000. In either case, the result of the second determination can be held in a memory or the like. The correction may be processing to substitute the data signal detected to be blackened by the second determination with a data signal of a saturation level, for example.

Examples of the determination results and operations based on the determination results are listed in the following table. In the table, the gain applied to the low-luminance data signal is merely an example. Also, as described above, the purpose of the determination is not limited to AGC control and blackened pixel detection used in this example. Furthermore, three or more types of determination may be performed. For example, the low-luminance range may be divided, and the types of determination may be increased to perform AGC control in a more detailed manner.

|  | First determination | Second determination | a_gain | d_gain |
| --- | --- | --- | --- | --- |
| Low luminance | H | H | ×8 | ×⅛ |
| High luminance (≤ saturation) | L | H | ×1 | ×1 |
| Ultra-high luminance (supersaturation) | L | L | ×1 | ×1 |

Because a determination circuit is provided that determines the amplitude of the signal read out from the pixel to the vertical signal line, the photoelectric conversion device of the present embodiment is capable of executing appropriate processing on the basis of the determination result inside or outside the photoelectric conversion device. In particular, by performing a plurality of types of amplitude determination at the determination circuit while the pixel is being selected for the signal to be read out, for example, blackened pixel detection, adjustment of the gain applied to the data signal, and other similar processing to help improve image quality can be achieved.

First Modified Example

Figure 6:
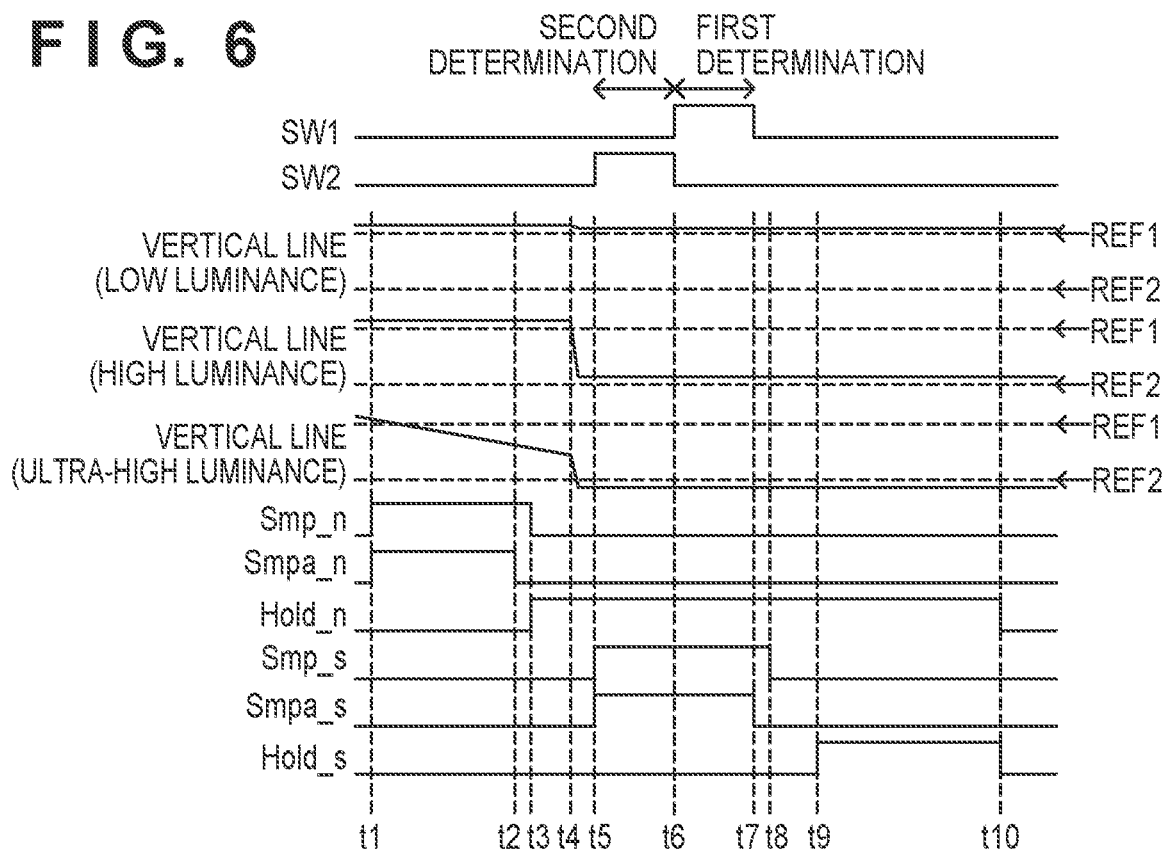
FIG. 6 is a timing diagram relating to an example operation of the photoelectric conversion device of FIG. 1 according to a first modified example.

FIG. 6 is a diagram illustrating, for the first modified example in which the determination circuit 20 has the configuration illustrated in FIG. 4B, an example of a change in the electric potential of the vertical signal line 30 and the operation timing of the switches of the sample and hold circuits 210 and 211 and the switch of the determination circuit 20. In the present modified example, the first determination and the second determination are performed in the sampling period of the data signal.

In FIG. 6, the sampling period of the data signal is the period from time t5 to t7. Here in the illustrated example, the second determination is performed in the period from time t5 to t6, and the first determination is performed in the period from time t6 to t7. Time t6 is a point in time where the period from time t5 to t7 is divided evenly in half.

In the period from time t1 to t5, the control signals of the switches SW1 and SW2 are both a low level. Thus, the switches SW1 and SW2 are off, and amplitude determination processing is not executed. When time t5 is reached, the control signal of the switch SW2 switches to a high level and the switch SW2 turns on. The switch SW1 stays off. In this manner, the second reference value REF2 is input to the inverting input of the comparator 80. Because the data signal is input into the non-inverting input of the comparator 80 via the vertical signal line 30, the output of the comparator 80 is, as the result of the second determination, output to outside of the photoelectric conversion device 1000 from the output circuit 100 after being held by the latch 70. In a case where there is a circuit that uses the result of the second determination inside the photoelectric conversion device 1000, the circuit references the state of the latch 70 in the period from time t5 to t6.

When time t6 is reached, the control signal of the switch SW2 switches to a low level and the switch SW2 turns off. Also, the control signal of the switch SW1 switches to a high level and the switch SW1 turns on. In this manner, the first reference value REF1 is input to the inverting input of the comparator 80. Because the data signal is continually being input into the non-inverting input of the comparator 80 via the vertical signal line 30, the output of the comparator 80 is held by the latch 70 as the result of the first determination.

By the resistance value of the variable resistance device 240 being adjusted by the determination circuit 20 on the basis of the result of the first determination, the analog gain for the post-CDS data signal input to the analog-to-digital conversion circuit 390 is adjusted. Also, the data processing circuit 90 adjusts the digital gain applied to the digital signal output from the analog-to-digital conversion circuit 390 on the basis of the result of the first determination held by the latch 70.

Other operations are as described above using FIG. 5, and the description thereof are omitted. Note that the order of the first determination and the second determination may be reversed.

In the present modified example, in addition to the effect described above, because the configuration of the determination circuit 20 can be simplified, the circuit scale can be reduced.

Second Modified Example

In the first modified example, the first determination and the second determination are performed sequentially in the sampling period of the data signal. In the present modified example, either the first determination or the second determination is performed outside of the sampling period of the data signal. Specifically, the second determination is performed in a period (for example, the sampling period of the reset signal) before the start of data signal output.

Figure 7:
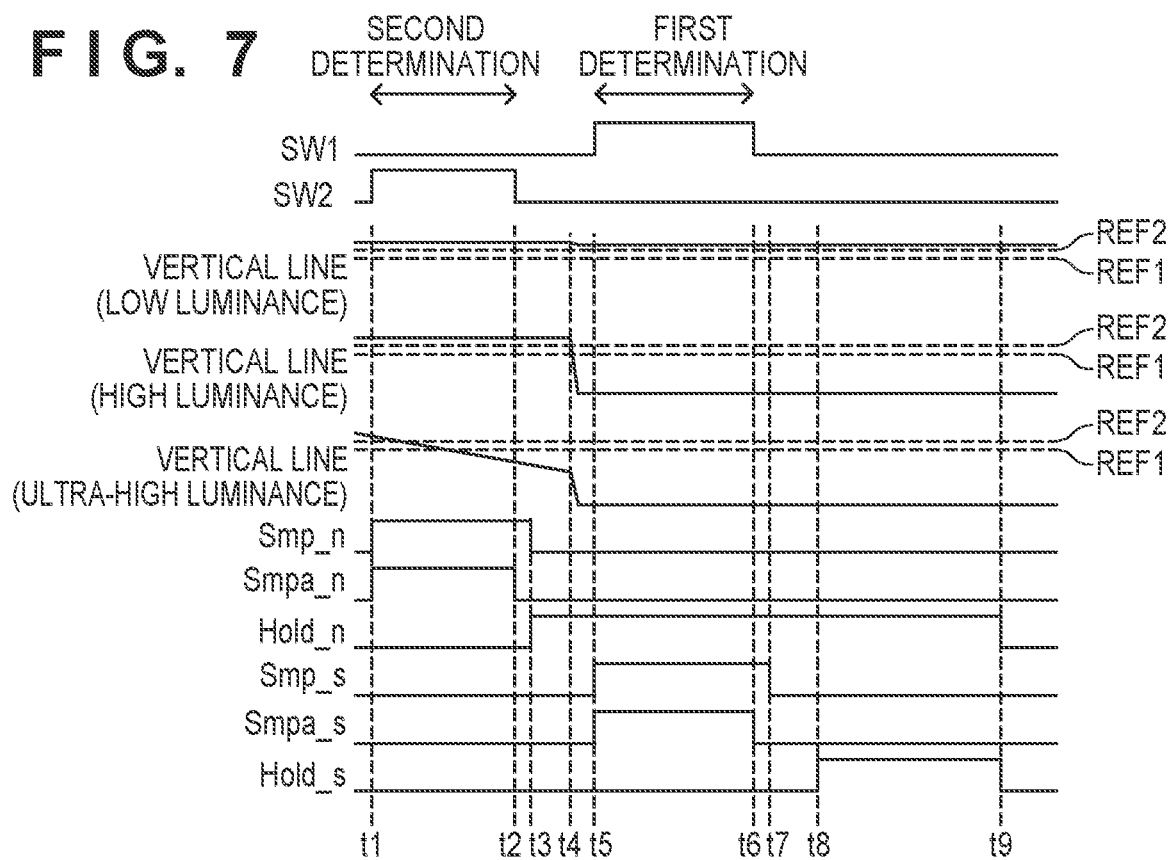
FIG. 7 is a timing diagram relating to an example operation of the photoelectric conversion device of FIG. 1 according to a second modified example.

FIG. 7 is a diagram illustrating, for the second modified example, an example of a change in the electric potential of the vertical signal line 30 and the operation timing of the switches of the sample and hold circuits 210 and 211 and the switch of the determination circuit 20. Here, the determination circuit 20 has the configuration illustrated in FIG. 4B. Because the first determination and the second determination do not need to be performed in parallel, the determination circuit 20 can appropriately perform with a configuration including a single comparator.

The read out period of the reset signal starts from time t1. Because the amplitude determination for the reset signal is performed at the determination circuit 20, the control signal of the switch SW2 is a high level at time t1. The control signal of the switch SW1 stays at a low level. In this manner, the second reference value REF2 is input to the inverting input of the comparator 80. Because the reset signal is being read out to the vertical signal line 30, the output of the comparator 80 corresponds to the result of the second determination. Note that in the present modified example, the second determination is performed for the reset signal and not the data signal, and thus, the value of the second reference value REF2 is different from that in the embodiment and the first modified example. A value for detecting the amplitude of the reset signal unable to occur in a state in which there is no blooming is used as the second reference value REF2. For example, the second reference value REF2 may be a value corresponding to ⅛ amplitude of the full scale.

In a case where there is blooming, the charge overflowing from the photoelectric conversion device in the read out period of the reset signal overflows into the floating diffusion and changes the level of the reset signal over time. In the example of FIG. 7, the level of the reset signal at the point of time corresponding to time t1 is not lower than the second reference value REF2, but is lower than the second reference value REF2 in the period until time t2 when the reset signal is held. Accordingly, the output of the comparator 80 at time t2 is a low level, and the result of determination indicates pixel blackening has occurred.

When time t2 is reached, the control signal of the switch SW2 switches to a low level and the second determination ends. Thereafter, the read out period of the data signal starts from time t4, and at the time when sampling of the data signal is performed at time t5, the control signal of the switch SW1 switches to a high level. The control signal of the switch SW2 stays at a low level. In this manner, the first reference value REF1 is input to the inverting input of the comparator 80. Because the data signal is being read out to the vertical signal line 30, the output of the comparator 80 corresponds to the result of the first determination.

Thereafter, at time t6 when sampling of the data signal is performed, the control signal of the switch SW1 switches to a low level and the first determination ends.

In the present modified example, in addition to an effect similar to that of the first modified example, the time restrictions on determination processing can be alleviated more so than in the first modified example.

Third Modified Example

Figure 8:
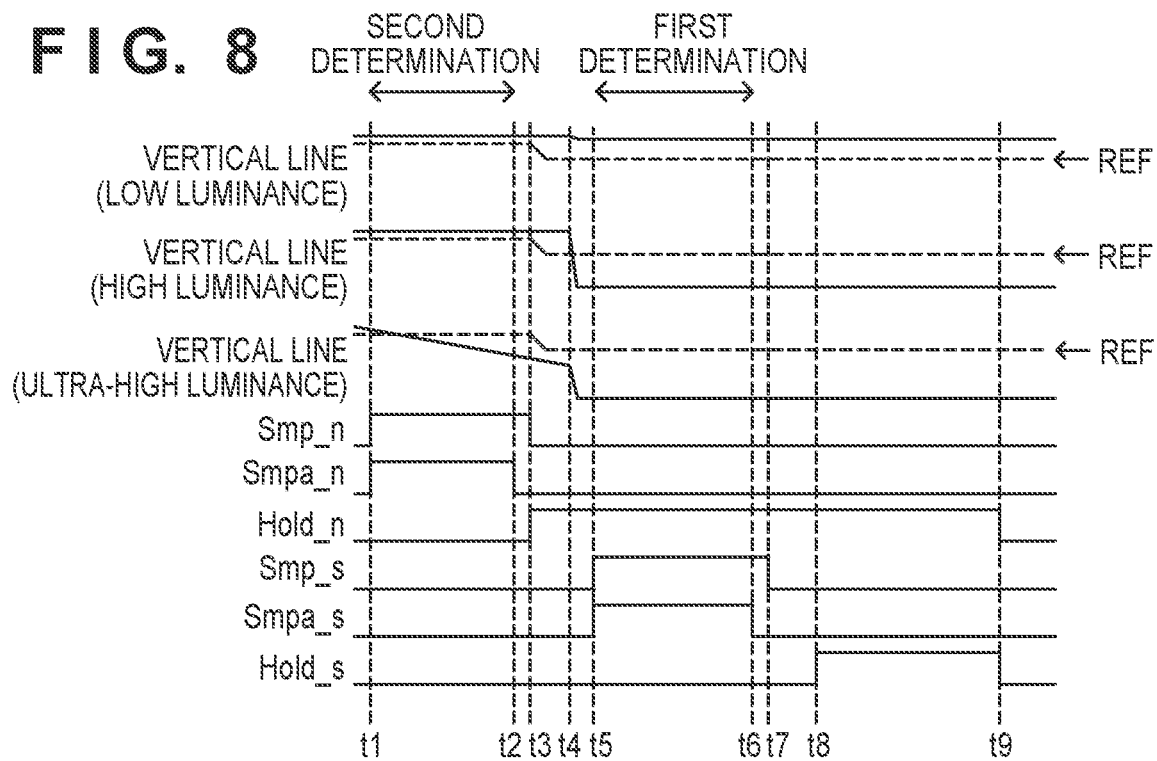
FIG. 8 is a timing diagram relating to an example operation of the photoelectric conversion device of FIG. 1 according to a third modified example.

FIG. 8 is a diagram illustrating, for the third modified example in which the determination circuit 20 has the configuration illustrated in FIG. 4C, an example of a change in the electric potential of the vertical signal line 30, the operation timing of the switches of the reference value sample and hold circuits 210 and 211, and the control of the reference value used at the determination circuit 20. In the present modified example, the first determination and the second determination are performed at the same time as in the second modified example.

In the present modified example, the reference value supplied to the inverting input of the comparator 80 is variable, and the second reference value REF2 is supplied in the period in which the second determination is performed and the first reference value REF1 is supplied in the period in which the first determination is performed. For example, the reference value circuit 21 supplies the second reference value REF2 from time t1 to t2 and the first reference value REF1 from time t5 to t6 are reference values REF to the inverting input of the comparator 80. The present modified example is the same as the second modified example except for the method of supplying the reference value.

In the present modified example, in addition to an effect similar to that of the second modified example, the signal lines for supplying a reference value can be reduced.

Fourth Modified Example

Figure 9:
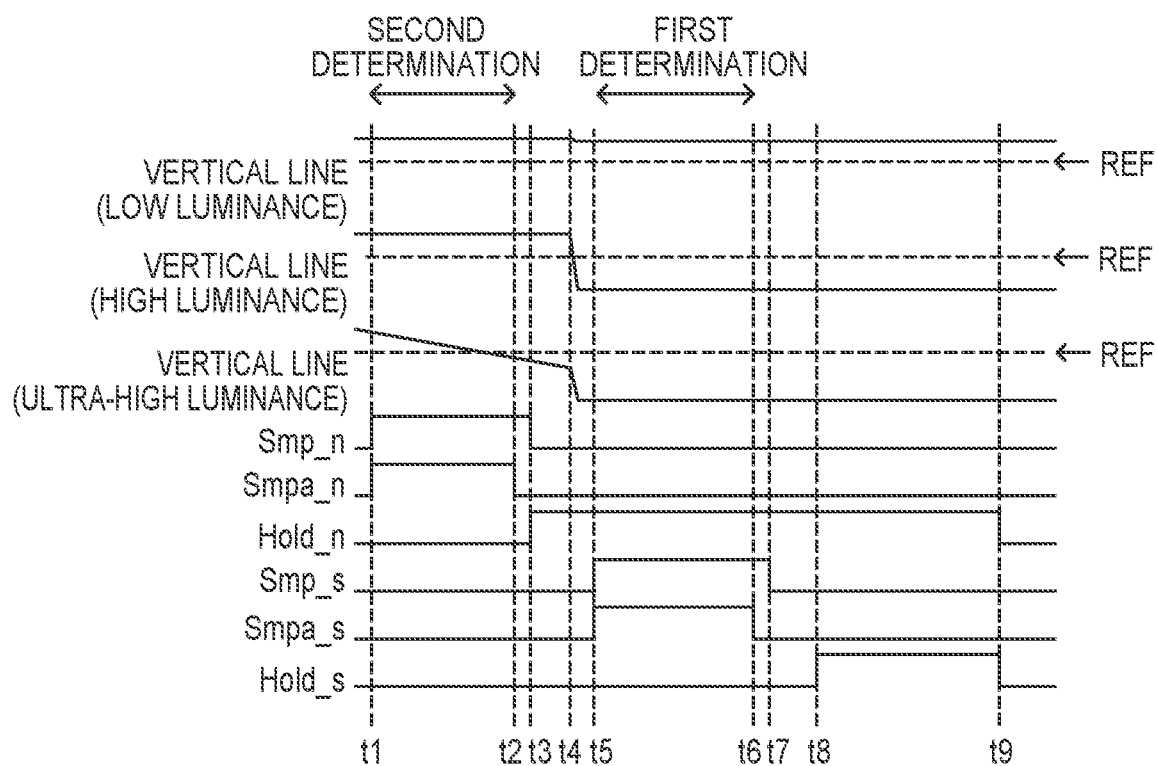
FIG. 9 is a timing diagram relating to an example operation of the photoelectric conversion device of FIG. 1 according to a fourth modified example.

The configuration in which the first determination and the second determination each use separate reference values will now be described. However, the same reference value may be used in both the first determination and the second determination. FIG. 9 is a diagram illustrating, for the fourth modified example, an example of a change in the electric potential of the vertical signal line 30, the operation timing of the switches of the reference value sample and hold circuits 210 and 211, and the control of the reference value used at the determination circuit 20.

FIG. 9 corresponds to FIG. 8 except that the value of the reference value REF does not change. In the present modified example, the most appropriate reference value cannot be used in the determinations, however, because the reference value does not need to be made variable, the configuration (for example, the configuration of the reference value circuit 21) for supplying the reference value can be simplified. The other effects of the present modified example are similar to those of the third modified example.

Here, the second reference value REF2 appropriate for the second determination is also used in the first determination. However, the first reference value REF1 appropriate for the first determination may be used in the second determination, or a third reference value REF3 different from the first reference value REF1 and the second reference value REF2 may be used in the first determination and the second determination. The result of the first determination is used in the photoelectric conversion device 1000. The result of the second determination is output to outside the photoelectric conversion device 1000, for example. The result of the second determination can be held in a memory or the like to be output to outside, for example.

Fifth Modified Example

In the examples described above, various types of amplitude determination with different purposes are performed. However, the present invention may be applied in cases where amplitude determination is performed a number of times for the same purpose. For example, in a case where the capacity of the floating diffusion (node 420) of the pixel is variable, the capacity of the floating diffusion may be changed and the data signal may be read out a number of times.

FIG. 10 is a diagram illustrating, for a case where the capacity of the floating diffusion changes and the data signal is read out a number of times, an example of the change in the electric potential of the vertical signal line 30, the operation timing of the switches of the reference value sample and hold circuits 210 and 211, and the reference value used at the determination circuit 20. In the present modified example, the determination circuit 20 has the configuration of FIG. 4C.

In this example it is assumed that the first determination is performed on data signals read out two times. Thus, the first reference value REF1 is continuously supplied to the determination circuit 20. The first determination is performed the first time in the sampling period (from time t5 to t6) of the first data signal.

After the data signal is held, at time t10, for example, the capacity of the floating diffusion is increased to increase the dynamic range of the pixel. Also, the sampling period of the second data signal is started at time W. By changing the capacity of the floating diffusion, the amplitude of the data signal is changed. Thus, the first determination is performed the second time in the sampling period (from time t11 to t12) of the second data signal. The first determination result held at the latch 70 is overwritten by the second determination result.

According to the present modified example, in a case where the capacity of the floating diffusion is changed, amplitude determination can be performed again on the signal corresponding to the post-change capacity. Thus, in a case where amplitude determination is performed for the purpose of AGC, for example, gain adjustment can be performed appropriately in accordance with the amplitude of the final data signal.

Note that in the example described above, as an example of performing the same determination a number of times, the amplitude of the data signal is determined each time the capacity of the floating diffusion of the pixel is changed. However, the same determination may be performed on the reset signal level. For example, in a case where the reset signal level is A/D converted, the capacity of the floating diffusion may change depending on the result of the second determination on the reset signal. By the second determination being performed a second time on the reset signal read out after the change in capacity, even in a case where the capacity of the floating diffusion is changed, appropriate blackened pixel detection can be performed.

According to the present modified example, in a case where the capacity of the floating diffusion is changed after amplitude determination, the amplitude is determined again for the signal read out after the change in capacity. Thus, appropriate amplitude determination can be performed on the signal read out from the pixel with a variable floating diffusion capacity.

Sixth Modified Example

In a case where the comparators 80 and 81 used by the determination circuit 20 are implemented via a differential amplifier, a decrease in accuracy may be caused by input offset. Thus, by using the comparator 80 with a configuration that corrects input offset, the determination accuracy can be increased.

Figure 11A:
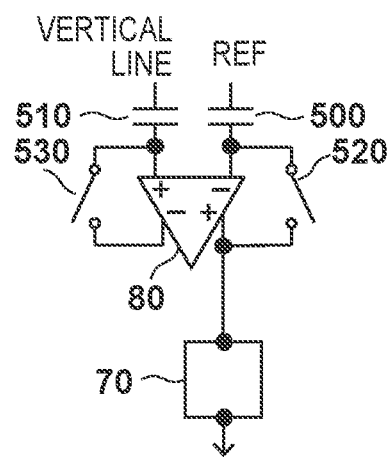
FIGS. 11A and 11B are circuit diagrams relating to other example configurations of the determination circuit of the photoelectric conversion device of FIG. 1.
Figure 11B:
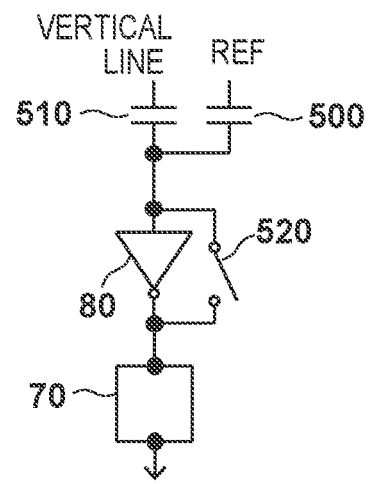

FIGS. 11A and 11B are diagrams illustrating example configurations of a comparator capable of correcting input offset that can be used as the comparators 80 and 81 of the determination circuit 20.

The comparator 80 in FIG. 11A includes two capacitive devices 500, 510 for input and feedback switches 520 and 530. The feedback switch 520 includes one end connected to an inverting input terminal and the other end connected to a non-inverting output terminal. The feedback switch 530 includes one end connected to a non-inverting input terminal and the other end connected to an inverting output terminal.

Note that the output of the comparator 80 is a non-inverting output terminal, and the terminal is connected to the input terminal of the latch 70. The capacitive device 500 is connected to the inverting input terminal, and the capacitive device 510 is connected to the non-inverting input terminal. The reference value is supplied to the inverting input terminal via the capacitive device 500, and the vertical signal line 30 is connected to the non-inverting input terminal via the capacitive device 500.

In a state where the reset signal is supplied to the non-inverting input and the reference value REF is supplied to the inverting input, in this state, the switches 520 and 530 are turned on (made conductive) and then turned off to give the capacitive devices 500 and 510 the same electric potential difference. This allows the input offset voltage of the comparator 80 to be cancelled.

The configuration of FIG. 11B is the same as that of FIG. 11A, except that the differential amplifier forming the comparator 80 is a single-ended differential amplifier. Even with this configuration, in a state where the reset signal is supplied to the non-inverting input and the reference value REF is supplied to the inverting input, in this state, the switches 520 and 530 are turned on (made conductive) and then turned off. This allows the input offset voltage of the comparator 80 to be cancelled.

Note that the comparator 80 may have a discretionary known configuration for a so-called auto-zero differential amplifier. The configurations illustrated in FIGS. 11A and 11B are merely examples.

Seventh Modified Example

Figure 12:
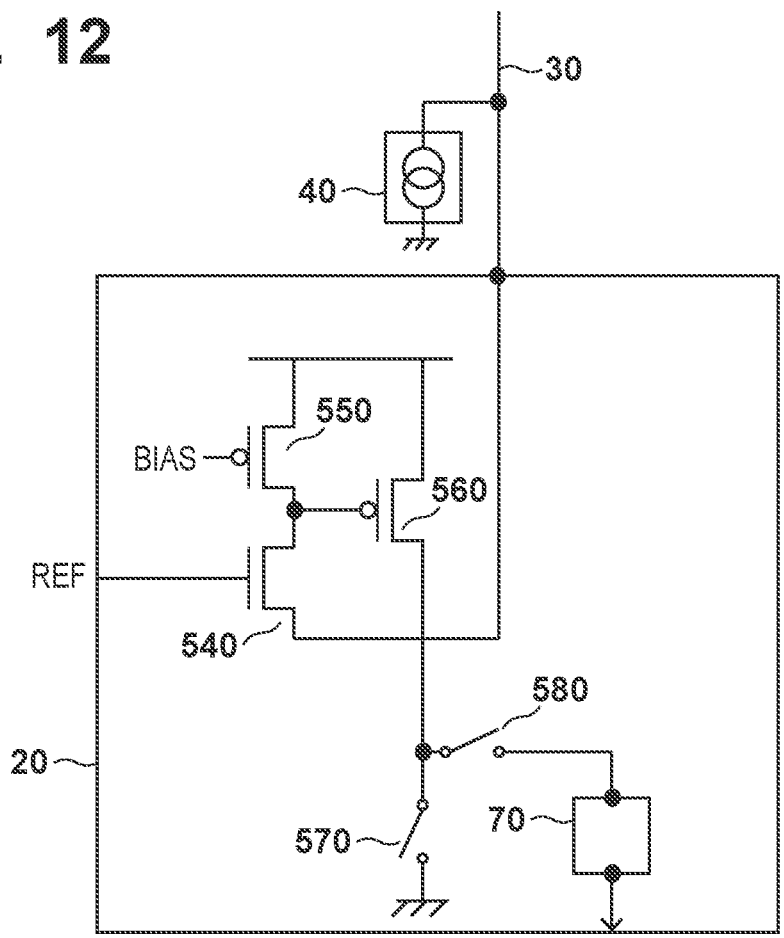
FIG. 12 is a circuit diagram relating to yet another example configuration of the determination circuit of the photoelectric conversion device of FIG. 1.

FIG. 12 is a diagram illustrating a configuration in which the determination circuit 20 is driven by the current source 40 of the vertical signal line 30 that supplies current to the selection transistor 440 and the amplification transistor 430 of the pixel 10. This configuration achieves greater power consumption reduction than a configuration in which the determination circuit 20 is driven by a different power supply.

The comparator includes an N-type MOS transistor 540, P-type MOS transistors 550 and 560, and a reset switch 570. The vertical signal line 30 is connected to the source of the transistor 540, and the reference value REF is input into the gate. Also, the transistor 550 is connected to the power supply voltage and the transistor 540, and a bias voltage is applied to the gate. The transistor 560 is connected to the power supply voltage and the latch 70, and the voltage of the connection point between the transistors 540 and 550 is applied to the gate. The output of the transistor 560 is input into the latch 70. Also, the reset switch 570 is a switch that resets the latch 70 when on.

When the electric potential of the vertical signal line 30 decreases to equal to or less than (reference voltage REF− threshold voltage Vth of the transistor 540), the transistor 540 turns on. When the transistor 540 is turned on, the current flows toward the current source 40. Accordingly, the gate voltage of the transistor 560 is decreased and the transistor 560 is turned on. Because of this, the latch 70 remains a high level. The reference voltage REF may be the first reference value REF1 or may be the second reference value REF2. Also, in a case where determination is performed a number of times, the reset switch 570 is turned to on and the previous determination result is reset before performing a new determination.

According to this present modified example, because the determination circuit 20 is driven by the current source 40 of the vertical signal line 30, power consumption can be reduced.

Eighth Modified Example

Figure 13:
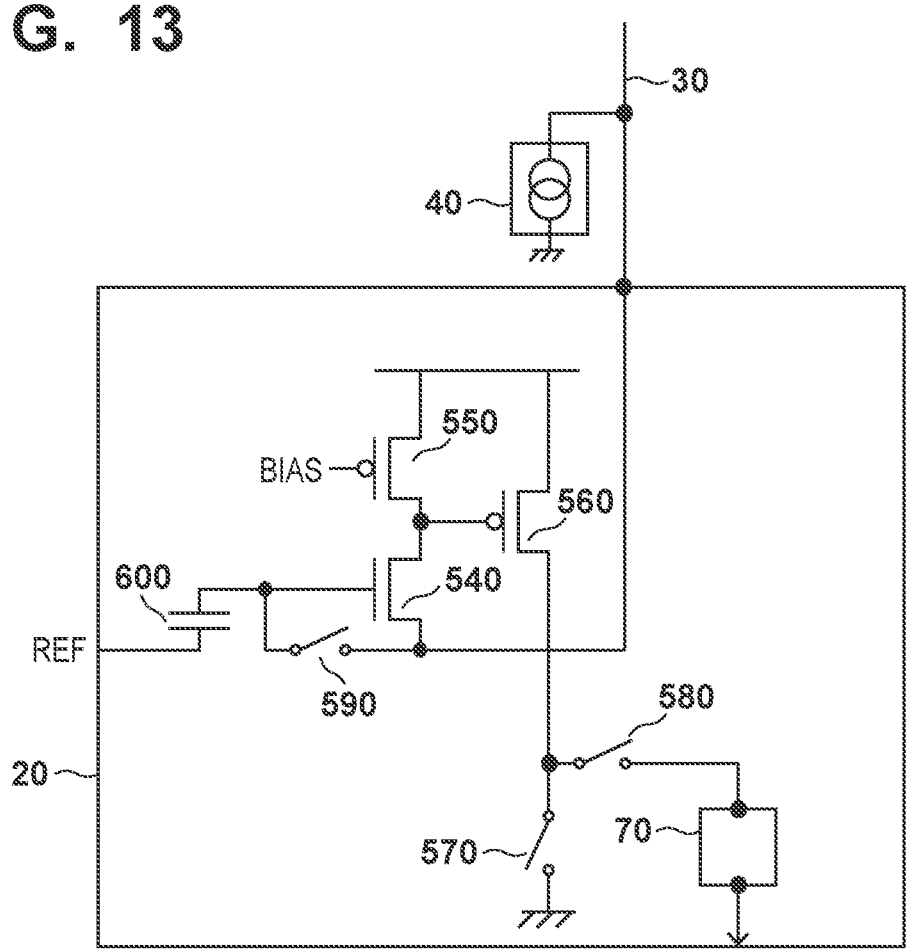
FIG. 13 is a circuit diagram relating to yet another example configuration of the determination circuit of the photoelectric conversion device of FIG. 1.

FIG. 13 is a diagram illustrating another mode in which the determination circuit 20 is driven by the current source 40 of the vertical signal line 30. Components that are the same as in the seventh modified example are given the same reference sign as that used in FIG. 12 and descriptions thereof are omitted. The determination circuit 20 according to the present modified example has the configuration of that according to the seventh modified example, but in addition, it is configured to hold the electric potential of the vertical signal line 30.

Specifically, a switch 590 that connects and disconnects the source and the gate of the transistor 540 and a capacitive device 600 between the gate of the transistor 540 and the reference value input terminal are additionally provided.

In a state in which the reset signal is being read out to the vertical signal line 30, by turning on the switch 590, the vertical signal line 30 is connected to the capacitive device 600. When the switch 590 is turned on, the electric potential of the reset signal is held at the capacitive device 600. The capacitive device 600 functions as a holding circuit for the electric potential of the reset signal.

In this state, when the reference value REF is reduced by just $\Delta V$ and the reduced amount is applied to the capacitive device 600, an electric potential of (reset signal−$\Delta V$) is applied to the gate of the transistor 540. By adjusting $\Delta V$ so that the transistor 540 turns on when the electric potential of the vertical signal line 30 is reduced by just ⅛ of the reset signal, i.e., the full scale, the first determination can be performed on the data signal. In this manner, in the present modified example, the reset signal of the reference of the vertical signal line 30 is used in the reference of the gate electric potential of the transistor 540.

Thus, according to the present modified example, the amplitude can be determined in a state in which the variation in the threshold voltage Vth of the source follower transistor at the output stage of the pixel reading out the signal is suppressed and the increased determination accuracy can be achieved.

As described above, the photoelectric conversion device according to the present embodiment includes a determination circuit that determines the amplitude of a signal read out from a pixel or an amplitude of a signal based on the read out signal. While the pixel is being selected for the signal to be read out, at the determination circuit, various types of amplitude determination are performed or amplitude determination is performed at various different timings. Thus, either inside or outside the photoelectric conversion device, appropriate processing can be executed on the basis of the determination result. By using the determination result, for example, blackened pixel detection and adjustment of gain applied to the data signal can be achieved and image quality improvement can be achieved.

Other Embodiments

Figure 14:
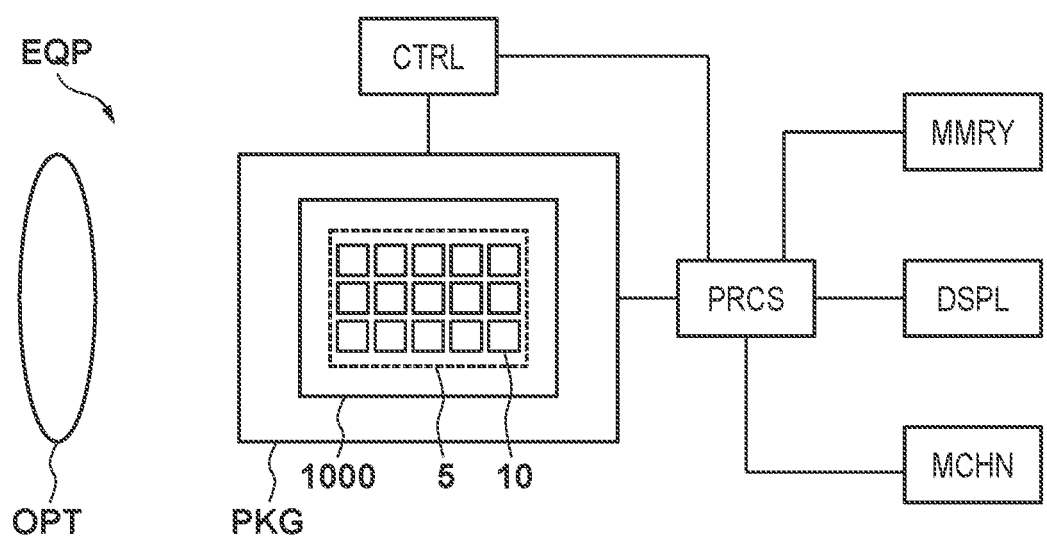
FIG. 14 is a diagram illustrating an example configuration of a camera installed with a photoelectric conversion device according to an embodiment.

Application examples of the photoelectric conversion device 1000 according to the embodiments described above will be described below. FIG. 14 is a schematic diagram of an electronic device EQP installed with the photoelectric conversion device 1000. In the example illustrated in FIG. 14, the electronic device EQP is a camera. Here, the concept "camera" includes in its meaning not only an apparatus with the main purpose of capturing images, but also apparatuses (for example, a personal computer, a smart phone, and other portable terminals) that can be provided with an image capture function via an auxiliary.

The photoelectric conversion device 1000 may be a semiconductor chip with a multilayer structure provided with the pixel array 5. As illustrated in FIG. 14, the photoelectric conversion device 1000 is housed in a semiconductor package PKG. The package PKG may include a base where the photoelectric conversion device 1000 is fixed, a cover body disposed opposite the photoelectric conversion device 1000, and an electrical conductive connection member that connects the terminal provided on the base and the terminal provided on the photoelectric conversion device 1000. The cover body may be made of glass, for example. Also, the connection member may be a bonding wire, bump, or the like. The device EQP may further include any one of an optical system OPT, a control apparatus CTRL, a processing apparatus PRCS, a display apparatus DSPL, or a storage apparatus MMRY.

The optical system OPT is a lens, shutter, mirror, or the like that forms an image in the photoelectric conversion device 1000. The control apparatus CTRL is a semiconductor device such as an ASIC or a similar apparatus that controls the operations of the photoelectric conversion device 1000. The processing apparatus PRCS is a semiconductor device, such as a CPU, ASIC, or the like, or a similar apparatus that processes the signal output from the photoelectric conversion device 1000. The display apparatus DSPL is an EL display apparatus, a liquid crystal display device, or the like that displays the image data obtained by the photoelectric conversion device 1000. The storage apparatus MMRY is a magnetic device, semiconductor device, or the like that stores the image data obtained by the photoelectric conversion device 1000. The storage apparatus MMRY may be volatile memory, such as SRAM, DRAM, or the like, or may be non-volatile memory, such as a flash memory, a hard disk drive, or the like. A machine apparatus MCHN includes a moving unit or a propulsion unit such as a motor, engine, or the like. The machine apparatus MCHN of the camera is capable of driving the components of the optical system OPT for zooming, focusing, and shutter operations. In the device EQP, the image data output from the photoelectric conversion device 1000 is displayed on the display apparatus DSPL, transmitted to outside via a communication apparatus (not illustrated) provided in the device EQP, or the like. Thus, the device EQP may be provided with the storage apparatus MMRY and/or the processing apparatus PRCS.

The camera installed with the photoelectric conversion device 1000 may be used as a surveillance camera, an in-vehicle camera installed on a transport device, such as an automobile, a railway vehicle, a watercraft, an aircraft, or an industrial robot, or the like. In addition, the camera installed with the photoelectric conversion device 1000 is not limited to being used in a transport device and may be used in a wide-range of device that use object recognition such as an intelligent transportation system (ITS).

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-45159, filed on Mar. 18, 2021, which is hereby incorporated by reference herein in its entirety.

What is claimed is:

1. A photoelectric conversion device, comprising:
a pixel that generates a signal via photoelectric conversion, wherein from the pixel, a reset signal and a data signal are read out; and
a determination circuit that determines an amplitude of a signal read out from the pixel to a vertical signal line,
wherein the determination circuit performs a first determination on the data signal while the pixel is being selected for reading out a signal and performs a second determination on the reset signal,
wherein the determination circuit is driven by a current source connected to the vertical signal line of the pixel, and
wherein the determination circuit includes a holding circuit that holds an electric potential of a reset signal read out to the vertical signal line and determines an amplitude of the signal using a reference value from which an electric potential of the reset signal held by the holding circuit has been subtracted.

2. The photoelectric conversion device according to claim 1, further comprising:
an analog-to-digital (A/D) conversion circuit that converts a signal based on either or both of the reset signal and the data signal into a corresponding digital signal.

3. The photoelectric conversion device according to claim 1, wherein the determination circuit performs the first determination in a first period and performs the second determination in a second period.

4. The photoelectric conversion device according to claim 3, wherein the determination circuit includes a first determinator that performs the first determination and a second determinator that performs the second determination.

5. The photoelectric conversion device according to claim 1, wherein the determination circuit uses a first reference value in the first determination and uses a second reference value in the second determination.

6. The photoelectric conversion device according to claim 1, wherein the determination circuit uses an identical reference value in the first determination and the second determination.

7. The photoelectric conversion device according to claim 6, wherein a result of the first determination is used by the photoelectric conversion device, and a result of the second determination is output outside of the photoelectric conversion device.

8. The photoelectric conversion device according to claim 1, wherein the determination circuit is an auto-zero differential amplifier with a function that takes the signal and a reference value for determination of an amplitude of the signal as input and cancels input offset.

9. The photoelectric conversion device according to claim 1, wherein the determination circuit holds a result of the determination of an amplitude of the signal with the result being readable from outside of the determination circuit.

10. The photoelectric conversion device according to claim 2, wherein the determination of an amplitude of the signal includes determination for adjusting an analog gain applied to the signal and a digital gain applied to the digital signal output from the A/D conversion circuit.

11. The photoelectric conversion device according to claim 1, wherein the determination of an amplitude of the signal includes determining whether or not the pixel is blackened.

12. An electronic device, comprising:
a photoelectric conversion device; and
a control apparatus that controls operations of the photoelectric conversion device,
wherein the photoelectric conversion device comprises:
(1) a pixel that generates a signal via photoelectric conversion, wherein from the pixel, a reset signal and a data signal are read out; and
(2) a determination circuit that determines an amplitude of a signal read out from the pixel to a vertical signal line,
wherein the determination circuit performs a first determination on the data signal while the pixel is being selected for reading out a signal and performs a second determination on the reset signal,
wherein the determination circuit is driven by a current source connected to the vertical signal line of the pixel, and
wherein the determination circuit includes a holding circuit that holds an electric potential of a reset signal read out to the vertical signal line and determines an amplitude of the signal using a reference value from which an electric potential of the reset signal held by the holding circuit has been subtracted.

13. A substrate stacked on a substrate provided with a pixel that generates a signal via photoelectric conversion, wherein from the pixel, a reset signal and a data signal are read out, comprising:
a determination circuit that determines an amplitude of a signal read out from the pixel to a vertical signal line,
wherein the determination circuit performs a first determination on the data signal while the pixel is being selected for reading out a signal and performs a second determination on the reset signal,
wherein the determination circuit is driven by a current source connected to the vertical signal line of the pixel, and
wherein the determination circuit includes a holding circuit that holds an electric potential of a reset signal read out to the vertical signal line and determines an amplitude of the signal using a reference value from which an electric potential of the reset signal held by the holding circuit has been subtracted.

* * * * *